United States Patent [19]

[11] 3,891,929

Carr et al.

[45] June 24, 1975

[54] ACOUSTIC SURFACE WAVE FREQUENCY SYNTHESIZER

[75] Inventors: Paul H. Carr, Bedford; Alan J. Budreau, Arlington, both of Mass.

[73] Assignee: The United States of America as represented by the Secretary of the Air Force, Washington, D.C.

[22] Filed: Jan. 14, 1974

[21] Appl. No.: 433,180

[52] U.S. Cl. .................. 328/14; 179/1 SA; 328/15; 333/72

[51] Int. Cl. .......................... H03b 19/00; H03h 7/10

[58] Field of Search .................. 333/72; 328/14, 15; 179/1 SA, 1 SG, 1 SM

[56] References Cited

UNITED STATES PATENTS

| | | | |
|---|---|---|---|
| 3,211,833 | 10/1965 | Warns | 179/1 SA |
| 3,243,703 | 3/1966 | Wood | 179/1 SA |
| 3,551,837 | 12/1970 | Speiser et al. | 333/72 |
| 3,824,586 | 7/1974 | Quate | 328/14 |
| 3,835,422 | 9/1974 | Harteman | 333/72 |

*Primary Examiner*—Stanley D. Miller, Jr.
*Attorney, Agent, or Firm*—Willard R. Matthews, Jr.

[57] ABSTRACT

Frequency synthesis is achieved by combining selected outputs from a multiplicity of acoustic surface wave filters. Each filter has a different filter pass frequency and in combination they define, in equal frequency increments, a given frequency. In a preferred embodiment the filters are fabricated as multiple parallel contiguous acoustic surface wave transmission channels on the propagating surface of a single piezoelectric substrate member. Input and output transducers are thinned interdigital electrodes with the output transducers being apodized in some instances. The filter outputs are fed to a switching matrix the output of which is controlled or coded by a number generator.

7 Claims, 9 Drawing Figures

ACOUSTIC SURFACE WAVE FREQUENCY SYNTHESIZER

BACKGROUND OF THE INVENTION

This invention relates to frequency synthesizers, and in particular to ultra high frequency synthesizers that utilize acoustic surface waves.

Conventional frequency synthesizers use separate oscillators. Their electronic circuits require mixers and multipliers. Consequently, the inherent complexity, weight and size of currently available frequency synthesizers often limit their utility. This is especially true of aerospace and satellite applications where cost, weight and size economies must be strictly observed. There currently exists, therefore, the need for simple, lightweight reliable frequency synthesizers that can be fabricated by integrated circuit techniques and utilized in various aerospace signal processing applications. The present invention is directed toward satisfying this need.

SUMMARY OF THE INVENTION

The present invention comprises an acoustic surface wave UHF frequency synthesizer. It uses a compact acoustic surface wave filter bank to separate multiple frequencies from a frequency-comb input. The output frequencies are continuously available for spread-spectrum, frequency-hop coding. This is accomplished by feeding the individual filter outputs into a switching matrix and controlling the switching matrix output with a system clock controlled number generator. The entire frequency synthesizer is fabricated on a single miniature piezoelectric crystal. The device utilizes a thinned-electrode transducer design to reduce second-order reflection effects and an isolation cavity design which yields suitable RF isolation in an extremely dense package.

It is a principal object of the invention to provide a new and improved frequency synthesizer.

It is another object of the invention to provide an improved UHF frequency synthesizer that utilizes acoustic surface waves.

It is another object of the invention to provide an improved frequency synthesizer that does not require frequency mixers and multipliers.

It is another object of the invention to provide an improved frequency synthesizer that does not require multiple oscillators.

It is another object of the invention to provide a frequency synthesizer that is less complex and more reliable than currently available devices.

It is another object of the invention to achieve substantial size, weight and cost reductions in the fabrication of improved UHF frequency synthesizers.

These, together with other objects, advantages and features of the invention will become more readily apparent from the following detailed description when taken in conjunction with the illustrated embodiment in the accompanying drawings.

DETAILED DESCRIPTION OF PREFERRED EMBODIMENT

Figure 1:
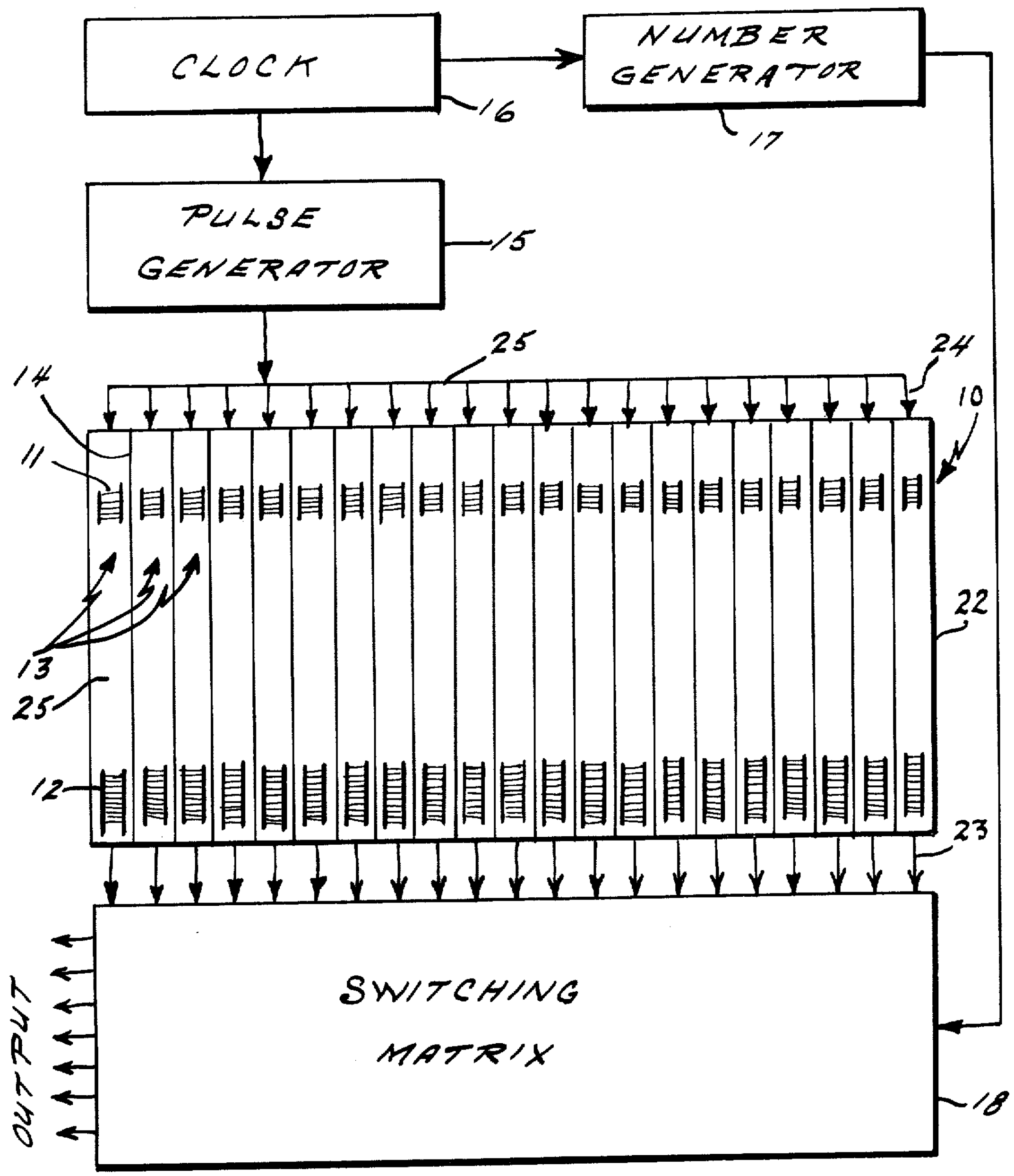
FIG. 1 illustrates, partially in block diagram form, the frequency synthesizer of the invention.
Figure 2:
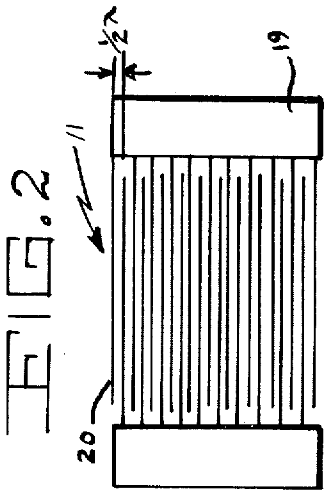
FIG. 2 illustrates an interdigital input transducer.
Figures 3, 4:
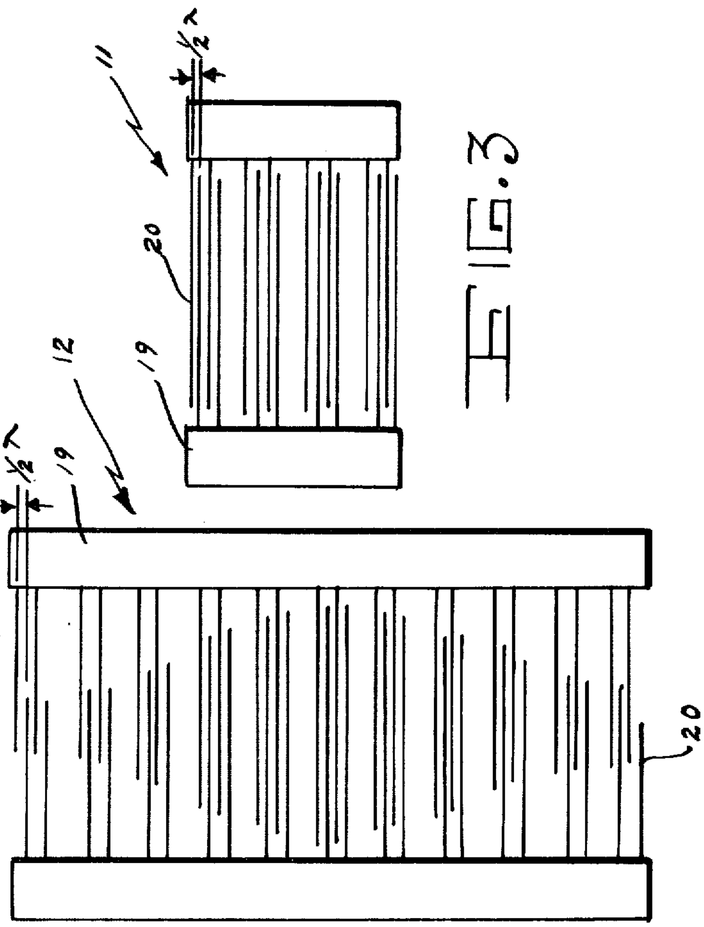
FIG. 3 illustrates a thinned-electrode interdigital input transducer.
FIG. 4 illustrates an apodized, thinned-electrode interdigital output transducer.
Figure 8:
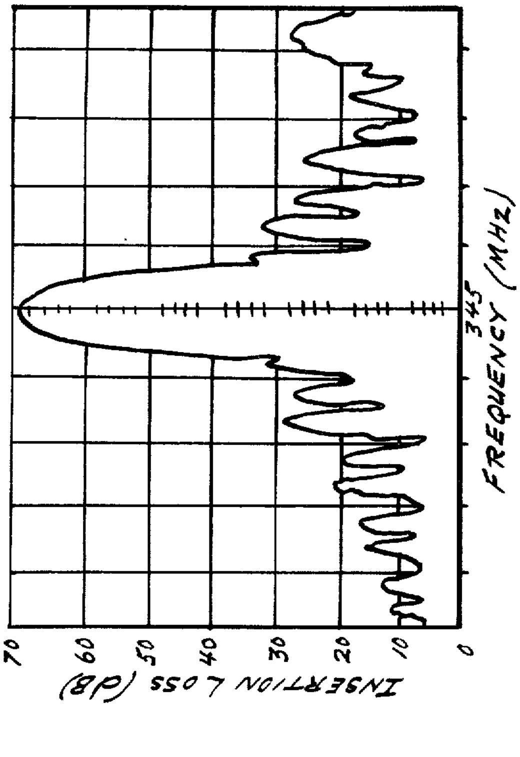
FIG. 8 is a curve illustrating the fundamental frequency response of a filter using the apodized output transducer of FIG. 4.
Figure 9:
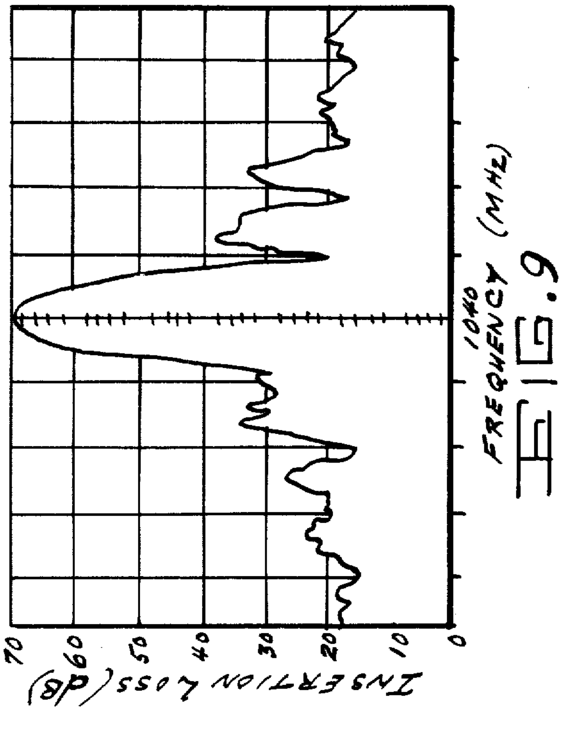
FIG. 9 is a curve illustrating the third harmonic frequency of the filter of FIG. 8.

Referring now to FIG. 1, there is illustrated thereby one presently preferred embodiment of the invention. Acoustic surface wave filter bank 10 is fed pulsed electromagnetic wave energy from pulse generator 15 through common bus 25 and feed circuits 24. The output circuits 23 of filter bank 10 are connected directly to switching matrix 18. The output of switching matrix 18 is controlled or coded by means of number generator 17 and the entire system is regulated by means of clock 16. Filter bank 10 is fabricated of a substrate member 22 of an appropriate piezoelectric material such as YZ cut lithium tantalate. It has an acoustic surface wave propagating surface 25 that is divided into a multiplicity of parallel contiguous filter channels 13. Channels 13 can be defined by photolithographically printed lines 14. Each filter channel includes an electromagnetic wave to acoustic surface wave transducer 11 and an acoustic surface wave to electromagnetic wave transducer 12. Input feed circuits 24 and output circuits 23 are connected to the transducer in a manner that minimizes the insertion loss. The transducers are preferably interdigital electrodes of the type illustrated in FIGS. 2, 3 and 4. Interdigital fingers 20 are spaced at one-half wavelength increments. FIG. 2 illustrates an input transducer 11 of conventional design wherein interdigital fingers 20 are positioned at every one-half wavelength and finger overlap is uniform and substantially fills the space between contact pads 19. FIG. 3 illustrates an input transducer 11 in which the interdigital fingers 20 have been thinned. FIG. 4 illustrates an output transducer 12 in which the interdigital fingers 20 have been both thinned and apodized. The apodization of the transducer of FIG. 4 (that is, the interdigital finger overlap variation) is an approximation of a $\cos^2$ function. By changing the actual lengths of the transducer lines in this manner the sidelobes can be reduced which is of practical importance when the magnitude of the center frequency of each null is not placed in the position for minimum response. For approximate Hamming Weighting, i.e., an apodization function approximated by a $\cos^2$ on a pedestal, the maximum sidelobes can be reduced by almost 40 db as shown by FIGS. 8 and 9.

Figure 5:
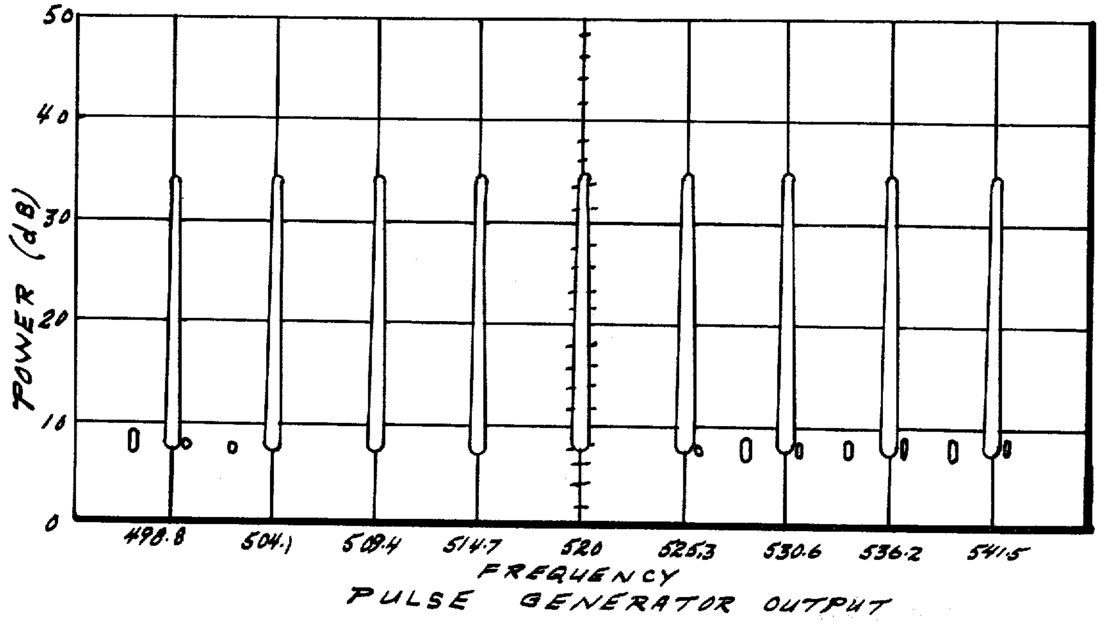
FIG. 5 illustrates spectrum analyzer measurements of the output spectrum of the pulse generator of FIG. 1.

By way of a specific example, a device using acoustic surface wave filters for multiple UHF frequency generation is hereinafter described. It comprises 21 continuous surface wave filters, which are spaced 5.3 MHz apart, from 520 to 650 MHz, and occupies the surface area of a 2 cm × 0.9 cm acoustic surface wave substrate member. Twenty-one CW UHF output frequencies are thus made simultaneously available for use in frequency synthesis and in spread-spectrum frequency-hop coding. The surface wave filter approach of the present invention has the advantages of small size and weight together with low cost, since the filters are fabricated by the same photolithographic techniques as integrated circuits. One novel feature of the frequency synthesizer of the invention is that the UHF frequencies are generated without the use of mixers or multipliers. The clock, which can be a stabilized quartz oscillator, establishes the repetition rate of the pulse generator, with a pulse-width chosen in the nanosecond region to provide a flat, uniformly-spaced comb spectrum to the contiguous 21-filter array. This comb spectrum is illustrated by FIG. 5. While this comb generation technique is inherently simple, other standard approaches can be used to provide a similar spectrum with more power in a limited band.

Figure 7:
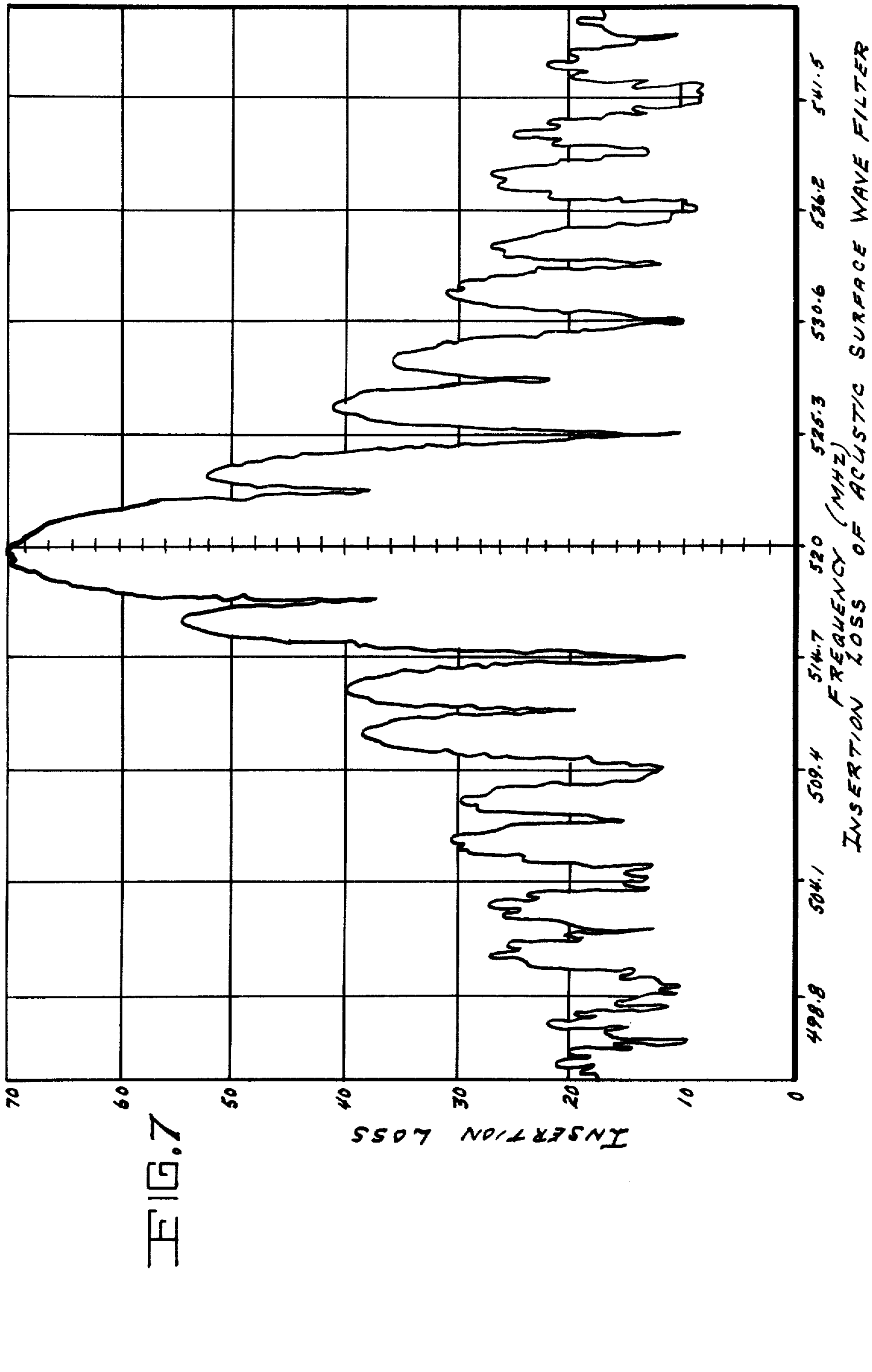
FIG. 7 is a curve illustrating the insertion loss as a function of frequency for the surface wave filter of FIG. 6.

The measured insertion loss versus frequency of a single filter is shown in FIG. 7. It is of the form $$\left[\frac{\sin X}{X} \cdot \frac{\sin 2X}{2X}\right]$$

where $X = \pi[(f - f_o)/f_c]$. $f$ is the applied frequency, $f_o$ is the filter pass frequency, and $f_c$ is chosen to equal the clock rate. The first term is characteristic of the interdigital input transducer and the second of the output transducer. Deep nulls are regularly spaced at intervals of $f_c$ above and below the filter pass frequency. Since the frequencies of the input comb spectrum are also spaced by $f_c$, this frequency response provides the required filtering.

At the filter pass-frequency, spurious multiple reflections between the aluminum thin-film transducer electrodes can cause drastic departures from the required response, since for these high-Q filters large numbers of electrodes are required. These reflections are minimized by using the thinned-electrode configuration shown in FIG. 3. Although this approach can cause the existence of secondary resonances, proper filter design will place these outside the frequency band of the synthesizer.

Figure 6:
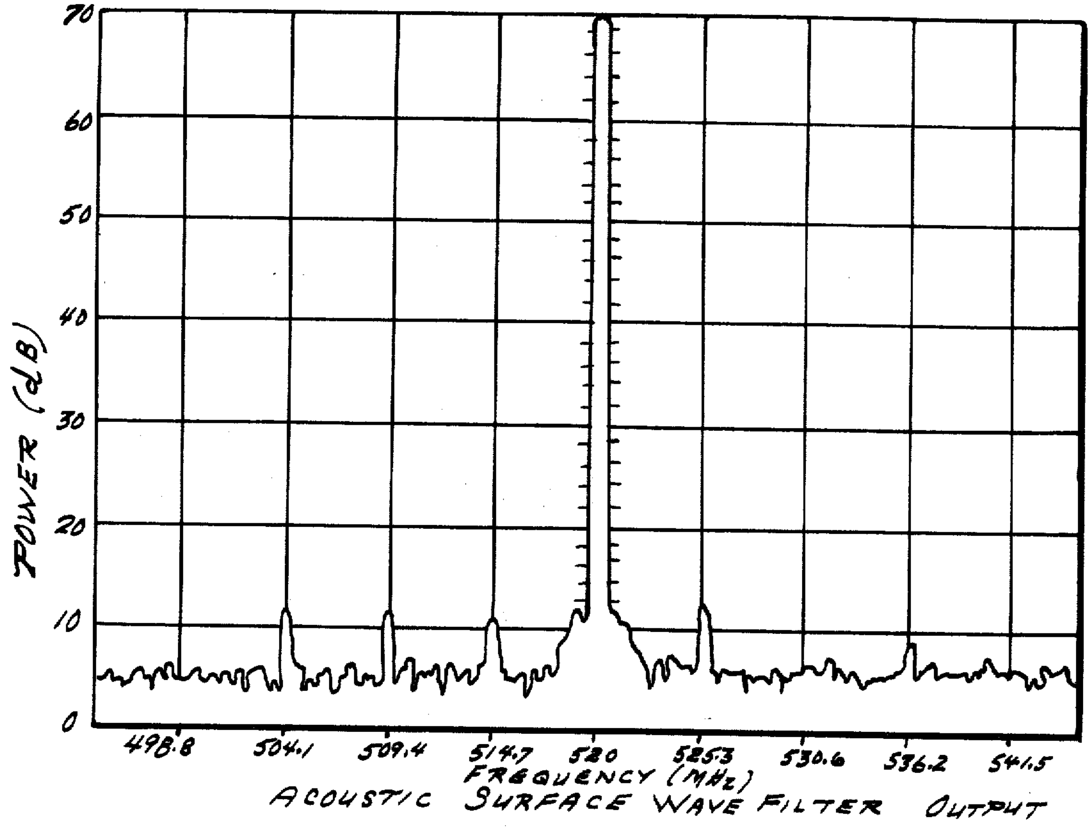
FIG. 6 illustrates spectrum analyzer measurements of the output of one surface wave filter of FIG. 1.

FIG. 6 shows a spectrum analyzer plot of a typical filter output for the input spectrum of FIG. 5. The rejected frequencies were down about 60 db relative to the passed frequency. This filter has a pass frequency of 520 MHz and a major null spacing of 5.3 MHz. The remaining 20 filters are similar in design and are spaced by 5.3 MHz across a band from 520 to 650 MHz. This is accomplished by varying the periodicity of the interdigital transducer electrodes, with the pass frequency determined by an electrode spacing equal to the corresponding acoustic half-wavelength. Precise null spacing is determined by overall transducer length.

The 21-transducer-pair master for the specific device herein described was fabricated with a step-and-repeat camera, whose position was controlled with a laser interferometer. The overall transducer dimensions were held to approximately 0.1 $\mu$m tolerances and the width of each transducer line was 1.5 $\mu$m. These values approach the practical limit of the present state-of-the-art for photolithographic fabrication. When contact printed on a YZ cut lithium tantalate substrate (0.9 × 2 cm) this master produced the contiguous filters discussed above, with relative pass frequencies accurate to 0.02 percent. To minimize unfiltered electromagnetic feedthrough there was used an isolation cavity configuration with direct wire-bonding to miniature coaxial cable in an extremely dense package containing 21 isolated channels. When compared to the conventional approach using separate oscillators and multipliers, a size and weight reduction of one to two orders of magnitude is obtained. This frequency synthesizer technique can be extended to higher frequencies by contact printing the same master onto an appropriate substrate member such as fast-velocity aluminum nitride-on-sapphire. This approach can result in contiguous filters spaced by 10 MHz at center frequencies above 1 GHz.

While the invention has been described in one presently preferred embodiment, it is understood that the words which have been used are words of description rather than words of limitation and that changes within the purview of the appended claims may be made without departing from the scope and spirit of the invention in its broader aspects.

What is claimed is:

1. An acoustic surface wave frequency synthesizer comprising a multiplicity of acoustic surface wave filters, each filter having an electromagnetic wave to acoustic surface wave input transducer and an acoustic surface wave to electromagnetic wave output transducer, a pulsed source of electromagnetic wave energy connected to supply, simultaneously, electromagnetic wave pulses to each filter input transducer, a system clock connected to said source of electromagnetic wave energy, a switching matrix having an output and multiple inputs, each filter output transducer being connected to a separate switch matrix input, and a switching matrix control means, said control means being connected to said switching matrix and to said system clock.

2. An acoustic surface wave frequency synthesizer comprising a single piezoelectric substrate member having an acoustic surface wave propagating surface, said propagating surface being divided into multiple parallel contiguous acoustic surface wave transmission channels, each transmission channel having an electromagnetic wave to acoustic surface wave input transducer and an acoustic surface wave to electromagnetic wave output transducer and constituting a discrete acoustic surface wave filter, a pulsed source of electromagnetic wave energy connected to supply, simultaneously, electromagnetic wave pulses to each filter input transducer, a system clock connected to said source of electromagnetic wave energy, a switching matrix having an output and multiple inputs, each said filter output transducer being connected to a separate switch matrix input, and a switching matrix control means, said control means being connected to said switching matrix and to said system clock.

3. An acoustic surface wave frequency synthesizer as defined in claim 2 wherein each filter has a discrete and different filter pass frequency, the combination of said filter pass frequencies defining, in substantially equal frequency increments, a given frequency band.

4. An acoustic surface wave frequency synthesizer as defined in claim 3 wherein said input and output transducers comprise thinned multiple finger interdigital electrodes.

5. An acoustic surface wave frequency synthesizer as defined in claim 4 wherein the interdigital fingers of said output transducer are apodized.

6. An acoustic surface wave frequency synthesizer as defined in claim 5 wherein the interdigital fingers of said output transducer are apodized in accordance with a $\cos^2$ apodization function.

7. An acoustic surface wave frequency synthesizer as defined in claim 6 wherein said piezoelectric substrate member consists of YZ cut lithium tantalate.

* * * * *